US012684905B2

(12) United States Patent
Yan et al.

(10) Patent No.: US 12,684,905 B2
(45) Date of Patent: Jul. 14, 2026

(54) LIGHT-EMITTING DEVICE, MANUFACTURING METHOD THEREOF AND DISPLAY APPARATUS

(71) Applicant: BOE Technology Group Co., Ltd., Beijing (CN)

(72) Inventors: Huajie Yan, Beijing (CN); Qian Sun, Beijing (CN); Mingxing Wang, Beijing (CN); Wei Li, Beijing (CN); Zhiqiang Jiao, Beijing (CN); Qingyu Huang, Beijing (CN); Mengna Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 384 days.

(21) Appl. No.: 18/579,356

(22) PCT Filed: Aug. 29, 2022

(86) PCT No.: PCT/CN2022/115410
§ 371 (c)(1),
(2) Date: Jan. 14, 2024

(87) PCT Pub. No.: WO2023/226222
PCT Pub. Date: Nov. 30, 2023

(65) Prior Publication Data
US 2024/0347678 A1 Oct. 17, 2024

(30) Foreign Application Priority Data
May 26, 2022 (CN) .......................... 202210585548.1

(51) Int. Cl.
*H10H 20/816* (2025.01)
*H10H 20/01* (2025.01)
(Continued)

(52) U.S. Cl.
CPC ........ *H10H 20/816* (2025.01); *H10H 20/819* (2025.01); *H10H 20/8514* (2025.01); *H10H 20/0361* (2025.01); *H10H 20/872* (2025.01)

(58) Field of Classification Search
CPC .................................................... H10H 20/819
See application file for complete search history.

(56) References Cited

U.S. PATENT DOCUMENTS

2011/0233514 A1* 9/2011 Lu ...................... H10H 20/8312
257/13
2012/0153254 A1 6/2012 Mastro
(Continued)

FOREIGN PATENT DOCUMENTS

CN 103022288 A 4/2013
CN 104051587 A 9/2014
(Continued)

*Primary Examiner* — Lauren R Bell

(74) *Attorney, Agent, or Firm* — HOUTTEMAN LAW LLC

(57) ABSTRACT

The present disclosure provides a light-emitting device, a method for manufacturing a light-emitting device and a display apparatus, and belongs to the field of display technology, and can solve the problem that the light-emitting device in the related art has low luminescence efficiency. The light-emitting device of the present disclosure includes: a substrate, a light-emitting diode on the substrate and a color conversion layer on a side of the light-emitting diode away from the substrate; the light-emitting device further includes: nano-metal particles; a plurality of grooves are formed in a surface of the light-emitting diode away from the substrate; and the nano-metal particles are filled in the plurality of grooves.

20 Claims, 10 Drawing Sheets

(51) Int. Cl.
_H10H 20/80_ (2025.01)
_H10H 20/819_ (2025.01)
_H10H 20/851_ (2025.01)

(56) References Cited

U.S. PATENT DOCUMENTS

2022/0229514 A1* 7/2022 Park ..................... H10H 20/851
2022/0384401 A1* 12/2022 Bok ..................... H10H 20/856

FOREIGN PATENT DOCUMENTS

| | | | |
|---|---|---|---|
| CN | 104201258 A | 12/2014 |
| CN | 105405938 A | 3/2016 |
| CN | 106449902 A | 2/2017 |
| CN | 110808315 A | 2/2020 |
| CN | 110828624 A | 2/2020 |
| CN | 114078897 A | 2/2022 |

* cited by examiner

LIGHT-EMITTING DEVICE, MANUFACTURING METHOD THEREOF AND DISPLAY APPARATUS

TECHNICAL FIELD

The present disclosure relates to the field of display technology, and in particular to a light-emitting device, a method for manufacturing a light-emitting device and a display apparatus.

BACKGROUND

Quantum dots (QD) as a novel luminescent material have the advantages of high purity of light color, high luminescence quantum efficiency, adjustable luminous color, long service life and the like, and thus, become a research hotspot of the current novel luminescent material. Therefore, a quantum dot light-emitting device with a quantum dot material as a luminescent layer has been a main direction of research of a novel display device.

In a quantum dot light-emitting device, the light emitted by a light-emitting diode may be used as the exciting light; the exciting light is irradiated to a color conversion layer, so that the color conversion layer may convert the exciting light into the light of different colors, to realize the full-color display effect of a display product. However, the light-emitting diode in the current quantum dot light-emitting device has low luminescence efficiency, and the color conversion layer has low color conversion efficiency, which cannot meet the requirements of the current display product.

SUMMARY

The present disclosure is directed to at least one of the technical problems in the prior art, and provides a light-emitting device, a method for manufacturing a light-emitting device, and a display apparatus.

In a first aspect, an embodiment of the present disclosure provides a light-emitting device, the light-emitting device includes: a substrate, a light-emitting diode on the substrate and a color conversion layer on a side of the light-emitting diode away from the substrate; the light-emitting device further includes: nano-metal particles; the light-emitting device further includes: a plurality of grooves in a surface of the light-emitting diode away from the substrate; and the nano-metal particles are filled in the plurality of grooves.

In some embodiments, the light-emitting device further includes: a metal layer; and the metal layer is on a side of the color conversion layer away from the substrate.

In some embodiments, the light-emitting diode includes: a first doped semiconductor layer and a second doped semiconductor layer opposite to each other and a quantum well layer between the first doped semiconductor layer and the second doped semiconductor layer; and the plurality of grooves are in a surface of the second doped semiconductor layer away from the substrate.

In some embodiments, a depth of each groove is less than a thickness of the second doped semiconductor layer.

In some embodiments, the light-emitting diode further includes: a current spreading layer; and the current spreading layer is on a side of the second doped semiconductor layer away from the substrate.

In some embodiments, the color conversion layer includes: a transparent conductive material layer and a quantum dot material layer; the transparent conductive material layer is on a side of the current spreading layer away from the substrate, and a surface of the transparent conductive material layer away from the substrate has a linear shape or a grid shape; and the quantum dot material layer is on a side of the transparent conductive layer away from the substrate.

In some embodiments, the color conversion layer includes: a mixture of a transparent conductive material and a quantum dot material.

In some embodiments, the transparent conductive material includes: at least one of graphene, carbon nanotubes and nano-metal particles.

In some embodiments, the color conversion layer includes: a quantum dot material; the light-emitting device further includes a plurality of pores in a surface of the current spreading layer away from the substrate; and the quantum dot material is filled in the plurality of pores.

In some embodiments, a surface of each of the plurality of pores is opposite in charge potential to a surface of the quantum dot material.

In some embodiments, the current spreading layer has a thickness in a range from 10 nanometers to 100 nanometers.

In some embodiments, each pore has a diameter in a range from 10 nanometers to 100 nanometers.

In some embodiments, the nano-metal particles and the metal layer are made of the same material.

In some embodiments, the material of the nano-metal particles includes: at least one of silver, gold, platinum, palladium and iridium.

In some embodiments, a diameter of each nano-metal particle is less than or equal to 100 nanometers; and a spacing value between any two adjacent nano-metal particles is greater than or equal to 1 micrometer.

In some embodiments, the first doped semiconductor layer includes a lapping stage; the light-emitting device further includes: a passivation layer covering the lapping stage and the metal layer, and a first connection electrode and a second connection electrode on a side of the passivation layer away from the substrate; the first connection electrode is electrically connected to the lapping stage through a via extending through the passivation layer; and the second connection electrode is electrically connected to the metal layer through a via extending through the passivation layer.

In a second aspect, an embodiment of the present disclosure provides a display apparatus including a plurality of light-emitting devices, each of which is the light-emitting device in the above embodiments.

In a third aspect, an embodiment of the present disclosure provides a method for manufacturing a light-emitting device, which includes: forming a light-emitting diode on a substrate; forming a plurality of grooves in a surface of the light-emitting diode away from the substrate; filling nano-metal particles in the plurality of grooves; and forming a color conversion layer on a side of the light-emitting diode away from the substrate.

In some embodiments, after the forming the color conversion layer on a side of the light-emitting diode away from the substrate, the method further includes: forming a metal layer on a side of the color conversion layer away from the substrate.

In some embodiments, the forming the light-emitting diode on the substrate, includes: sequentially forming a first doped semiconductor layer, a quantum well layer and a second doped semiconductor layer on the substrate.

In some embodiments, the filling the nano-metal particles in the plurality of grooves includes: forming a silicon oxide layer on a side of the second doped semiconductor layer away from the substrate; forming a patterned photoresist layer on a side of the silicon oxide layer away from the substrate; etching the silicon oxide layer and the second doped semiconductor layer by using the photoresist layer as a mask, the plurality of grooves are formed in a surface of the second doped semiconductor layer away from the substrate; forming a nano-metal particle layer on the silicon oxide layer, and annealing the nano-metal particle layer to form the nano-metal particles, so that the nano-metal particles are filled in the plurality of grooves; and stripping the silicon oxide layer by using an acid solution, so that the redundant nano-metal particles are removed along with the stripping of the silicon oxide layer.

In some embodiments, after the sequentially forming the first doped semiconductor layer, the quantum well layer and the second doped semiconductor layer on the substrate, the method further includes: forming a current spreading layer on a side of the second doped semiconductor layer away from the substrate.

In some embodiments, the forming the color conversion layer on a side of the light-emitting diode away from the substrate includes: forming a transparent conductive layer by spin-coating on a side of the current spreading layer away from the substrate, wherein a surface of the transparent conductive layer away from the substrate has a linear shape or a grid shape; and forming a quantum dot material layer by spin-coating on a side of the transparent conductive layer away from the substrate.

In some embodiments, the forming the color conversion layer on a side of the light-emitting diode away from the substrate includes: mixing a transparent conductive material and a quantum dot material to form a mixture, and forming the color conversion layer by spin-coating on a side of the current spreading layer away from the substrate.

In some embodiments, after the mixing the transparent conductive material and the quantum dot material to form the mixture, the method further includes: performing ultrasonic treatment on the mixture so that the transparent conductive material and the quantum dot material are dispersed.

In some embodiments, after the forming the current spreading layer on a side of the second doped semiconductor layer away from the substrate, the method further includes: performing a reductive etching reaction on the current spreading layer by using a zinc powder-ethanol solution, and forming a plurality of pores in a surface of the current spreading layer away from the substrate.

In some embodiments, after the forming the current spreading layer on a side of the second doped semiconductor layer away from the substrate, the method further includes: imprinting a photoresist by using a nano-imprinting template to form a patterned photoresist layer; and etching the current spreading layer by using the photoresist layer as a mask, and forming a plurality of pores in a surface of the current spreading layer away from the substrate.

In some embodiments, the forming the color conversion layer on a side of the light-emitting diode away from the substrate includes: processing the surface of the current spreading layer away from the substrate to change a potential of the surface; processing a quantum dot material solution, so that a potential of the quantum dot material is opposite to the potential of the surface of the current spreading layer away from the substrate; and spin-coating the quantum dot material solution on the surface of the current spreading layer away from the substrate, so that the quantum dot material is filled in the plurality of pores.

DETAIL DESCRIPTION OF EMBODIMENTS

In order to enable one of ordinary skill in the art to better understand the technical solutions of the embodiments of the present disclosure, the present disclosure will be described in further detail with reference to the accompanying drawings and the detailed description.

Unless defined otherwise, technical or scientific terms used herein shall have the ordinary meaning as understood by one of ordinary skill in the art to which the present disclosure belongs. The terms "first", "second", and the like used in the present disclosure are not intended to indicate any order, quantity, or importance, but rather are used for distinguishing one element from another. Further, the term "a", "an", "the", or the like used herein does not denote a limitation of quantity, but rather denotes the presence of at least one element. The term "comprising", "including", or the like means that the element or item preceding the term contains the element or item listed after the term and its equivalent, but does not exclude other elements or items. The term "connected", "coupled", or the like is not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

Figure 1:
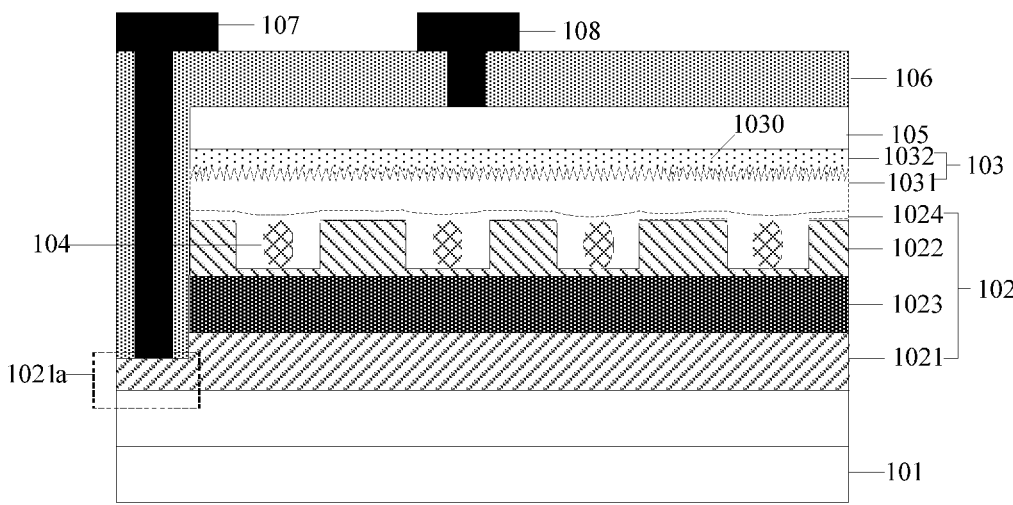
FIG. 1 is a schematic diagram of a structure of a light-emitting device according to an embodiment of the present disclosure.

In a first aspect, an embodiment of the present disclosure provides a light-emitting device. FIG. 1 is a schematic diagram of a structure of a light-emitting device according to an embodiment of the present disclosure. As shown in FIG. 1, the light-emitting device includes: a substrate 101, a light-emitting diode 102 positioned on the substrate 101, and a color conversion layer 103 positioned on a side of the light-emitting diode 102 away from the substrate 101; the light-emitting device further includes: nano-metal particles 104; a surface of the light-emitting diode 102 away from the substrate 101 is formed with a plurality of grooves therein; the nano-metal particles 104 are filled in the grooves.

The substrate 101 may be made of a rigid material such as glass, which can improve the carrying capacity of the substrate 101 for other layers thereon. Alternatively, the substrate 101 may be made of a flexible material such as polyimide (PI), which can improve the overall bending resistance and tensile resistance of the light-emitting device, and prevent the substrate 101 from being broken due to the stress generated during the bending, stretching, and twisting processes, resulting in defects such as open circuit or the like. In practical applications, the material of the substrate 101 may be selected appropriately according to actual needs to ensure that the light-emitting device has good performance. A buffer layer is generally disposed between the substrate 101 and the light-emitting diode 102, and a material of the buffer layer may be at least one of silicon nitride, silicon oxide, or silicon oxynitride.

The light emitted from the light-emitting diode 102 may be irradiated to the color conversion layer 103 as the exciting light, and may excite materials in the color conversion layer 103 to emit light and convert the color of the light, so that different light-emitting devices emit the light of different colors, and when the light-emitting device is applied to a display apparatus, multicolor display is realized. Specifically, the color of the light emitted by the light-emitting diode 102 is generally blue, and the color conversion layer 103 may emit red light or green light under the irradiation of the blue light, and the color of the light depends on the material of the color conversion layer 103, which may be selected according to actual needs, and will not be described herein again.

Figure 2:
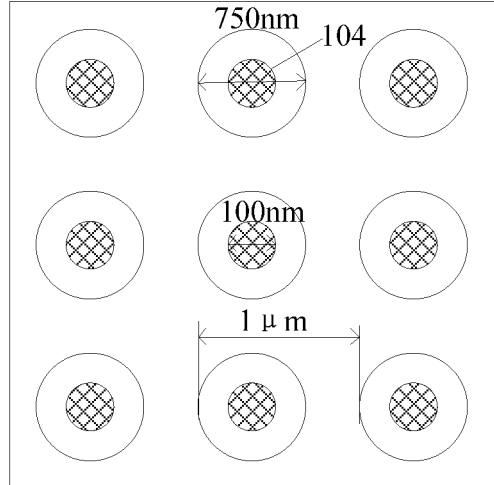
FIG. 2 is a schematic diagram of an arrangement of grooves and nano-metal particles in a light-emitting device according to an embodiment of the present disclosure.

The plurality of grooves are formed in the surface of the light-emitting diode 102 away from the substrate 101, and are periodically arranged, there is a certain distance between every two adjacent grooves, the nano-metal particles 104 are filled in the grooves and are also periodically arranged like the grooves, and the specific arrangement of the grooves and the nano-metal particles 104 may be as shown in FIG. 2. For example, a diameter of each of the nano-metal particles 104 may be 100 nanometers, a width of each of the grooves may be 750 nanometers, the distance between every two adjacent grooves may be 250 nanometers, that is, a periodical interval value of the grooves is 1 micrometer, and correspondingly, a periodical interval value of the nano-metal particles 104 is also 1 micrometer. The nano-metal particles 104 may be made of a material with good electrical conductivity, such as at least one of silver, gold, platinum, palladium, and iridium. In the embodiments of the present disclosure and the following description, silver is taken as an example for description.

In the light-emitting device provided by the embodiment of the present disclosure, during the light emitted from the light-emitting diode 102 is irradiated to the color conversion layer 103, the light may be firstly irradiated to the nano-metal particles 104 in the grooves, which form surface plasmons under the irradiation of the exciting light, and a very strong near-field magnetic field may be excited around the surface plasmons, thereby providing very high photon density of states, which can in turn enhance the self-luminous radiation efficiency of light emitters.

For the light-emitting diode 102, the surface plasmons formed by the nano-metal particles 104 can improve the brightness and the luminescence efficiency of the light-emitting diode 102. For the color conversion layer 103, the surface plasmons formed by the nano-metal particles 104 can shorten the fluorescence lifetime of the materials in color conversion layer 103, enhance the radiation rate of the materials, and thus improve the color conversion efficiency. The surface plasmons formed by the nano-metal particles 104 can improve the scattering rate of light, so as to facilitate the extraction of light, thereby improving the luminescence efficiency of the color conversion layer 103.

In addition, the nano-metal particles 104 are filled in the grooves which are periodically arranged, so that the action range of the surface plasmons formed by the nano-metal particles 104 in the grooves can be ensured, and the interaction between the surface plasmons formed by the nano-metal particles 104 in the adjacent grooves is avoided, and the luminous performance of the light-emitting device is not influenced.

In some embodiments, the light-emitting device further includes: a metal layer 105; the metal layer 105 is located on a side of the color conversion layer 103 away from the substrate 101.

The metal layer 105 may be made of a material with good electrical conductivity, such as at least one of silver, gold, platinum, palladium, and iridium. Preferably, the metal layer 105 and the nano-metal particles 104 are made of the same material. In the embodiments of the present disclosure and the following description, silver is taken as an example for description.

The metal layer 105 and the periodically arranged nano-metal particles 104 may form a gap mode of the surface plasmon in which the amount of the materials in the color conversion layer 103 can be increased by nearly 10,000 times, so that the luminescence efficiency of the light-emitting device can be further greatly increased. Meanwhile, the metal layer 105 may cover the color conversion layer 103 to protect the color conversion layer 103 against an external force.

In some embodiments, the light-emitting diode 102 includes: a first doped semiconductor layer 1021 and a second doped semiconductor layer 1022 which are oppositely arranged, and a quantum well layer 1023 between the first doped semiconductor layer 1021 and the second doped semiconductor layer 1022; the grooves are formed in a surface of the second doped semiconductor layer 1022 away from the substrate 101.

The first doped semiconductor layer 1021 and the second doped semiconductor layer 1022 are made of different types of semiconductor materials. Specifically, the first doped semiconductor layer 1021 may be an N-type doped semiconductor layer, and the second doped semiconductor layer 1022 may be a P-type doped semiconductor layer. For example, the first doped semiconductor layer 1021 may be made of N-GaN, and the second doped semiconductor layer 1022 may be made of P-GaN. The first doped semiconductor layer 1021 and the second doped semiconductor layer 1022 may form photons in the quantum well layer 1023 under the action of an electric field, and radiate the photons to realize luminous function. The grooves for accommodating the nano-metal particles 104 are formed in the surface of the second doped semiconductor layer 1022 away from the substrate 101, so that it is not necessary to separately provide a layer for the nano-metal particles 104, and the number of layers of the light-emitting device can be reduced, thereby reducing a thickness of the light-emitting device.

In some embodiments, as shown in FIGS. 1 and 2, a depth of each groove is less than a thickness of the second doped semiconductor layer 1022.

In practical applications, the depth of each groove may be less than the thickness of the second doped semiconductor layer 1022, so that the second doped semiconductor layer 1022 may be prevented from being etched through in the process for etching the grooves, so as to ensure a directly facing area between the second doped semiconductor layer 1022 and the first doped semiconductor layer 1021, thereby preventing the grooves from affecting the luminescence efficiency of the light-emitting diode 102.

In some embodiments, as shown in FIG. 1, the light-emitting diode 102 further includes: a current spreading layer 1024 located on a side of the second doped semiconductor layer 1022 away from the substrate 101.

The current spreading layer 1024 may play a role in conducting and spreading current. Specifically, the current spreading layer 1024 may be made of indium tin oxide (ITO) and has good conductivity, and is a transparent structure, so as to prevent light generated by the quantum well layer 1023 from being blocked.

In some embodiments, as shown in FIG. 1, the color conversion layer 103 includes: a transparent conductive material layer 1031 and a quantum dot material layer 1032; the transparent conductive material layer 1031 is located on a side of the current spreading layer 1024 away from the substrate 101, and a surface of the transparent conductive material layer 1031 away from the substrate 101 is in a linear shape or a grid shape; the quantum dot material layer 1032 is located on a side of the transparent conductive material layer 1031 away from the substrate 101.

Figure 3:
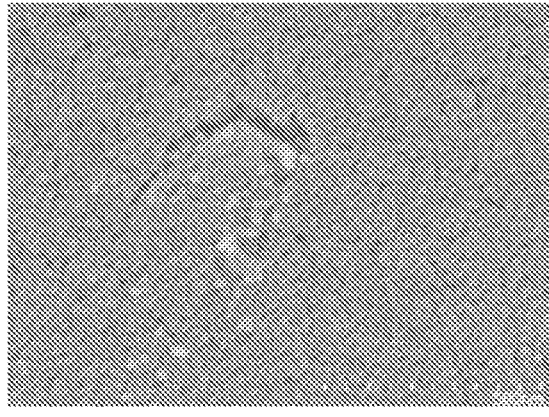
FIG. 3 is a schematic diagram showing a surface topography of a transparent conductive layer in a light-emitting device according to an embodiment of the present disclosure.

The color conversion layer 103 includes at least one transparent conductive material layer 1031 and at least one quantum dot material layer 1032 which are alternately arranged, the surface of the transparent conductive material layer 1031 away from the substrate 101 is in the linear shape or the grid shape, as shown in FIG. 3. It can be seen that the surface of the transparent conductive material layer 1031 away from the substrate is rough and uneven, which can provide a carrying space for a quantum dot material 1030 in the quantum dot material layer 1032, so that the quantum dot material 1030 may be filled in the formed linear or grid-shaped space, and quenching caused by agglomeration of the quantum dot material 1030 is avoided, thereby preventing the color conversion efficiency from being influenced and improving the luminescence efficiency of the light-emitting device.

Figure 4:
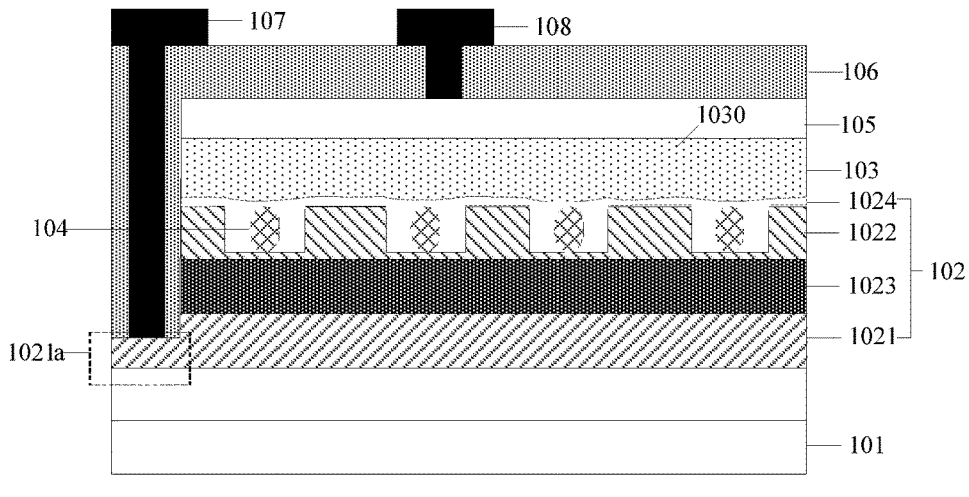
FIG. 4 is a schematic diagram of a structure of a light-emitting device according to an embodiment of the present disclosure.

In some embodiments, FIG. 4 is a schematic diagram of a structure of a light-emitting device according to an embodiment of the present disclosure. As shown in FIG. 4, the color conversion layer 103 in the light-emitting device includes: a mixture of a transparent conductive material and the quantum dot material 1030.

The light-emitting device shown in FIG. 4 is different from the light-emitting device shown in FIG. 1 in that the color conversion layer 103 in the light-emitting device shown in FIG. 4 is a single-layer structure, the material of which is the mixture of the transparent conductive material and the quantum dot material 1030. The quantum dot material 1030 can be dispersed because the transparent conductive material is mixed in the quantum dot material 1030, so that the quenching caused by the agglomeration of the quantum dot material 1030 is avoided, thereby preventing the color conversion efficiency from being influenced and improving the luminescence efficiency of the light-emitting device. Meanwhile, the color conversion layer 103 is the single-layer structure, so that it is only necessary in the process for forming the color conversion layer 103 to mix the transparent conductive material and the quantum dot material 1030 in advance to form the mixture followed by spin-coating, thereby forming the color conversion layer 103. In this way, the spin-coating process is prevented from being performed several times, the process steps can be reduced, the manufacturing cost is saved, the thickness of the color conversion layer 103 having the single-layer structure can be less, the thickness of the light-emitting device can be reduced, and the light-emitting device and the display apparatus are lighter and thinner.

In some embodiments, the transparent conductive material includes: at least one of graphene, carbon nanotubes and nano-metal particles.

The transparent conductive material may be at least one of graphene, carbon nanotubes and nano-metal particles, and thus, has good conductivity, and can avoid the quenching caused by the agglomeration of the quantum dot material 1030, thereby preventing the color conversion efficiency from being influenced and improving the luminescence efficiency of the light-emitting device. As the process for forming layers with the graphene material is complex during film forming, the transparent conductive material is preferably selected from carbon nanotubes and nano-silver particles.

Figure 5:
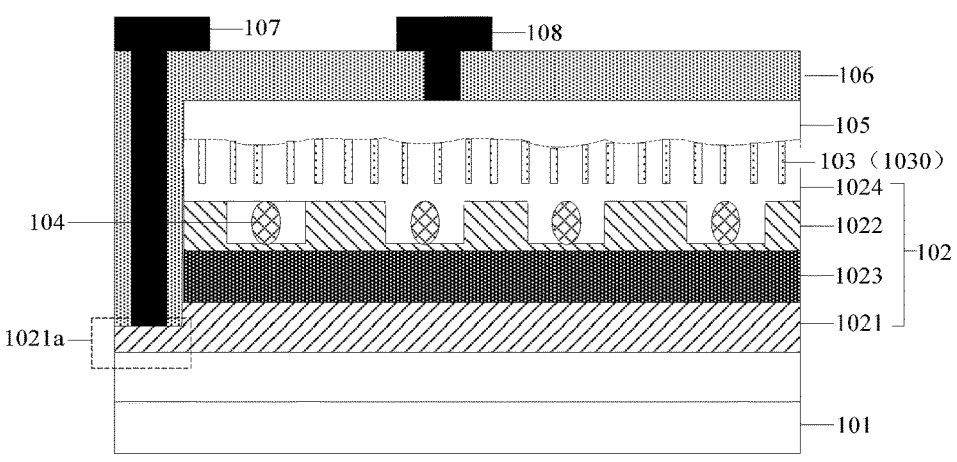
FIG. 5 is a schematic diagram of a structure of a light-emitting device according to an embodiment of the present disclosure.

In some embodiments, FIG. 5 is a schematic diagram of a structure of a light-emitting device according to an embodiment of the present disclosure. As shown in FIG. 5, the color conversion layer 103 includes: the quantum dot material 1030; a plurality of pores are formed in a surface of the current spreading layer 1024 away from the substrate 101; the quantum dot material 1030 is filled in the pores.

The quantum dot material 1030 may convert light into light of different colors under irradiation of the exciting light. Specifically, the quantum dot material 1030 may be perovskite or the like. The quantum dot material 1030 may be filled in the plurality of pores in a surface of the current spreading layer 1024 away from the substrate 101, so that it is not necessary to separately provide a layer for the quantum dot material 1030, and the number of layers of the light-emitting device can be reduced, thereby reducing the thickness of the light-emitting device.

In practical applications, a thickness of the current spreading layer 1024 is in a range from 10 nm to 100 nm, which can ensure that a distance between each of the nano-metal particles 104 and the metal layer 105 is maintained at in a range from 10 nm to 100 nm. In this way, it can be ensured that the gap mode of the surface plasmon may be formed between each of the nano-metal particles 104 and the metal layer 105, and quantum dot fluorescence quenching caused by a too close distance between the nano-metal particles 104 and the quantum dot material 1030 in the color conversion layer 103 can be avoided, so as to ensure the color conversion efficiency and the luminescence efficiency of the color conversion layer 103.

In some embodiments, a surface of each of the plurality of pores is opposite in charge potential to a surface of the quantum dot material 1030.

The surface of the quantum dot material generally has negative charges, and the current spreading layer 1024 is immersed in polyethylene glycol (PEG) or sodium polystyrene sulfonate (PSS) solution, so that the surfaces of the pores have positive charges, and thus the quantum dot material 1030 can be filled into the pores by virtue of an electrostatic adsorption force, thereby ensuring the thickness of the formed color conversion layer 103 and improving the color conversion efficiency and the luminescence efficiency of the color conversion layer 103.

In some embodiments, each of the pores have a diameter in a range from 10 nanometers to 100 nanometers.

The diameter of each of the pores may be in a range from 10 nanometers to 100 nanometers, and the quantum dot material 1030 may be filled in the pores in a nanometer scale, so that the quantum dot material 1030 is agglomerated in a nanometer scale, and quenching caused by agglomeration of the quantum dot material 1030 is alleviated. Meanwhile, a depth of each of the pores is generally less than the thickness of the current spreading layer 1024, so as to prevent the current spreading layer 1024 from being etched through, and prevent the luminous performance of the light-emitting device from being affected.

In some embodiments, the nano-metal particles 104 are made of the same material as the metal layer 105.

The nano-metal particles 104 and the metal layer 105 may be made of a material having good conductivity, and may be made of the same material, which, on one hand, facilitates to generate the surface plasmons, and on the other hand, can reduce the manufacturing difficulty, and save the manufacturing cost.

In some embodiments, as shown in FIGS. 1, 4 and 5, the first doped semiconductor layer 1021 has a lapping stage 1021a; the light-emitting device further includes: a passivation layer 106 covering the lapping stage 1021a and the metal layer 105, and a first connection electrode 107 and a second connection electrode 108 on a side of the passivation layer 106 away from the substrate 101; the first connection electrode 107 is electrically connected to the lapping stage 1021a through a via extending through the passivation layer 106; the second connection electrode 108 is electrically connected to the metal layer 105 through a via extending through the passivation layer 106.

Different voltage signals may be input into the first connection electrode 107 and the second connection electrode 108, and under the driving of the voltage signals, an electric field may be formed between the first doped semiconductor layer 1021 and the second doped semiconductor layer 1022, so that photons are generated in the quantum well layer 1023 and are radiated to realize the luminous function.

In a second aspect, an embodiment of the present disclosure provides a display apparatus, where the display apparatus includes a plurality of light-emitting devices provided in any of the above embodiments, and the display apparatus may specifically be: any product or component with a display function, such as a mobile phone, a tablet computer, a television, a display, a notebook computer, a digital photo frame, a navigator or the like, the realization principle and the beneficial effect of the display apparatus are the same as those of the above light-emitting device, and are not described herein again.

Figure 6:
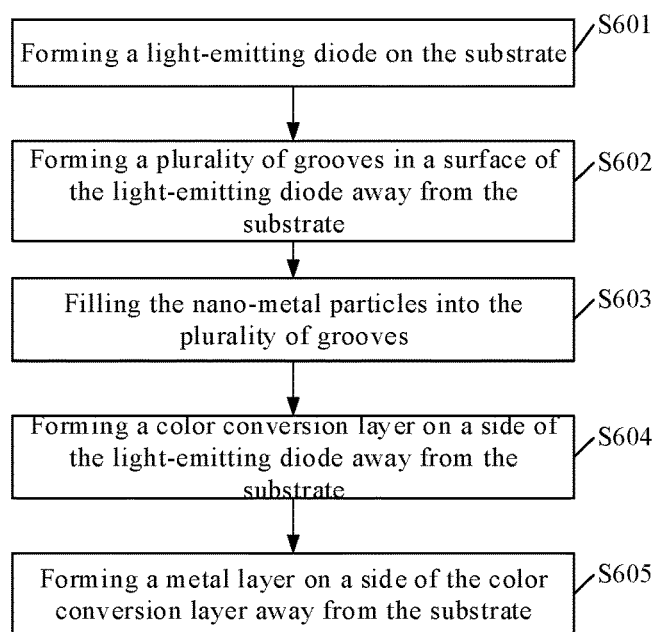
FIG. 6 is a schematic flow chart of a method for manufacturing a light-emitting device according to an embodiment of the present disclosure.
Figure 7A:
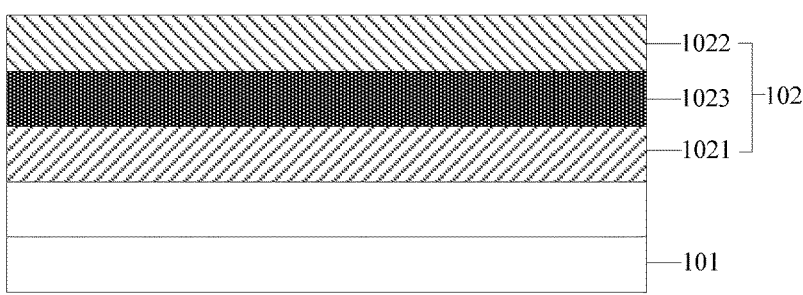
FIGS. 7a to 7y are schematic diagrams of intermediate structures corresponding to steps in a method for manufacturing a light-emitting device according to an embodiment of the present disclosure.

In a third aspect, an embodiment of the present disclosure provides a method for manufacturing a light-emitting device. FIG. 6 is a schematic flow chart of a method for manufacturing a light-emitting device according to an embodiment of the present disclosure. FIGS. 7a to 7y are schematic diagrams of intermediate structures corresponding to steps in a method for manufacturing a light-emitting device according to an embodiment of the present disclosure. The method for manufacturing a light-emitting device provided by the embodiment of the present disclosure will be described in further detail with reference to the accompanying drawings.

As shown in FIG. 6, a method for manufacturing a light-emitting device according to an embodiment of the present disclosure includes steps S601 to S603.

S601, forming a light-emitting diode on the substrate.

Specifically, as shown in FIG. 7a, the forming the light-emitting diode 102 on the substrate 101 may be specifically to form a buffer layer on the substrate 101, and then sequentially form a first doped semiconductor layer 1021, a quantum well layer 1023 and a second doped semiconductor layer 1022 on the buffer layer. In practical applications, the buffer layer only plays a role of buffering, and has no influence on the overall luminescence effect of the light-emitting device, so that whether to provide the buffer layer or not may be determined as required.

S602, forming a plurality of grooves in a surface of the light-emitting diode away from the substrate.

Figure 7B:
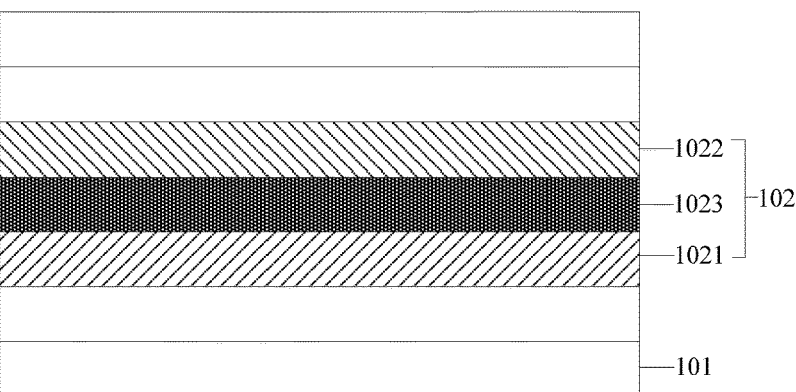
Figure 7C:
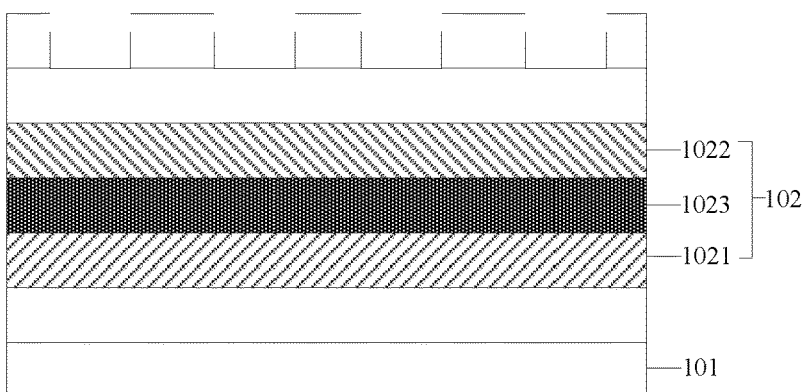
Figure 7D:
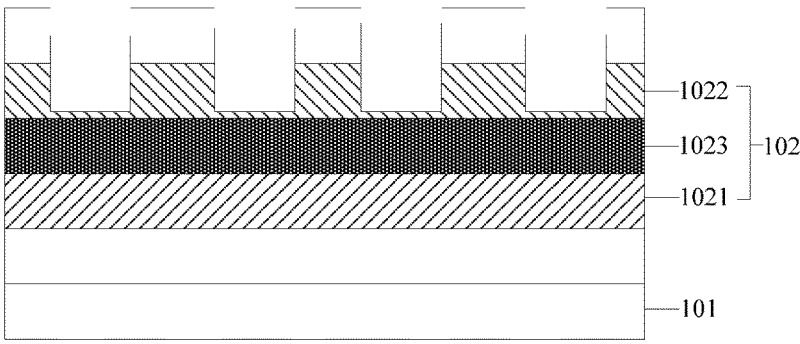

Specifically, as shown in FIGS. 7b to 7d, firstly, a layer of 120 nm thick silicon oxide (SiO2) is evaporated on the surface of the light-emitting diode 102 away from the substrate 101, i.e., an epitaxial slice of a surface of the second doped semiconductor layer 1022. For a template of the grooves, it is only necessary to spin-coat a single layer of nano-imprinting adhesive on the silicon oxide (SiO2) layer. And then, the substrate with the spin-coated imprinting adhesive is imprinted in a spinning mode through an IPS by using a nano-imprinting template having round hole patterns through a two-step method, so that the round hole patterns are transferred to the imprinting adhesive. Then, oxygen plasma is used to remove the residual adhesive, i.e., patterns of the pores of the imprinting adhesive are formed on the epitaxial slice of the light-emitting diode 102. By using the adhesive as a mask, the silicon oxide (SiO2) layer is etched through to the second doped semiconductor layer 1022 (P-type GaN) by using inductively coupled plasma (ICP) in an atmosphere of carbon tetrafluoride (CF4) or trifluoromethane (CHF3). Then, the second doped semiconductor layer 1022 is etched in an atmosphere of chlorine (Cl2)/boron trichloride (BCl3), and the etching duration is determined according to the required etching depth. In this way, a groove structure with the silicon oxide (SiO2) layer as a mask on the epitaxial slice of the light-emitting diode 102 may be obtained. S603, filling the nano-metal particles into the plurality of grooves.

Figure 7E:
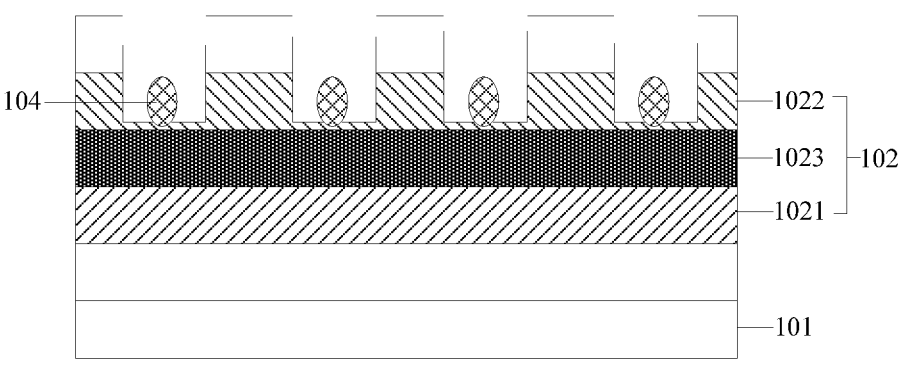
Figure 7F:
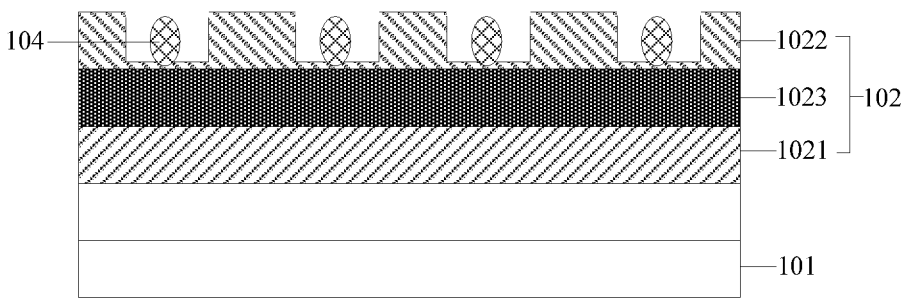

Specifically, as shown in FIGS. 7e to 7f, a metal layer, which may be made of silver (Ag) with a thickness of 30 nm, is deposited on the groove structure, and then annealed in an annealing furnace at 600° C. for 10 minutes. The nano-metal particles 104 are formed in the grooves and on the silicon oxide (SiO2) layer as the mask layer. The sample is immersed in a hydrofluoric acid (HF) solution, and is ultrasonically cleaned with a front surface (the second doped semiconductor layer 1022) facing down. In this process, the nano-metal particles 104 falling on the silicon oxide (SiO2) layer as the mask fall from the epitaxial slice as the silicon oxide (SiO2) layer dissolves in the hydrofluoric acid (HF) solution. At this point, the desired array of nano-metallic particles 104 is formed in the grooves.

S604, forming a color conversion layer on a side of the light-emitting diode away from the substrate.

Figure 7G:
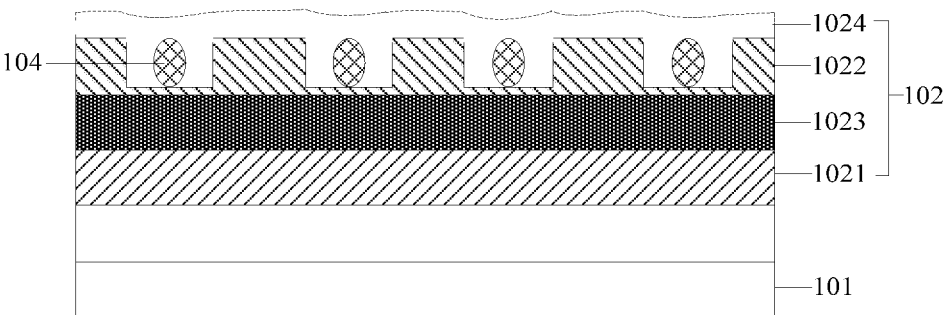
Figure 7H:
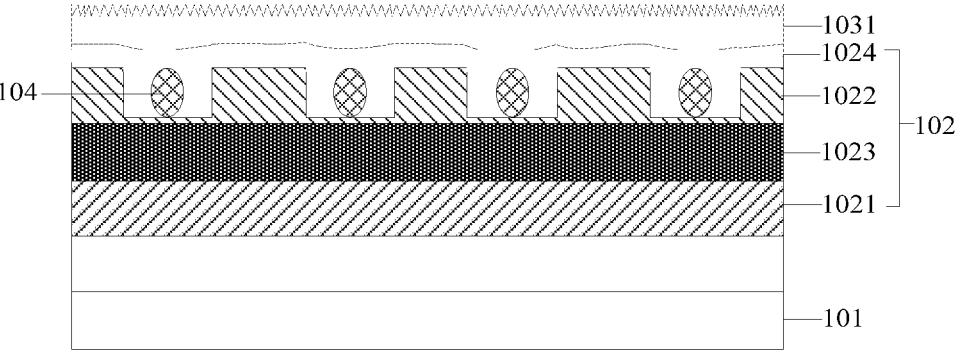
Figure 7I:
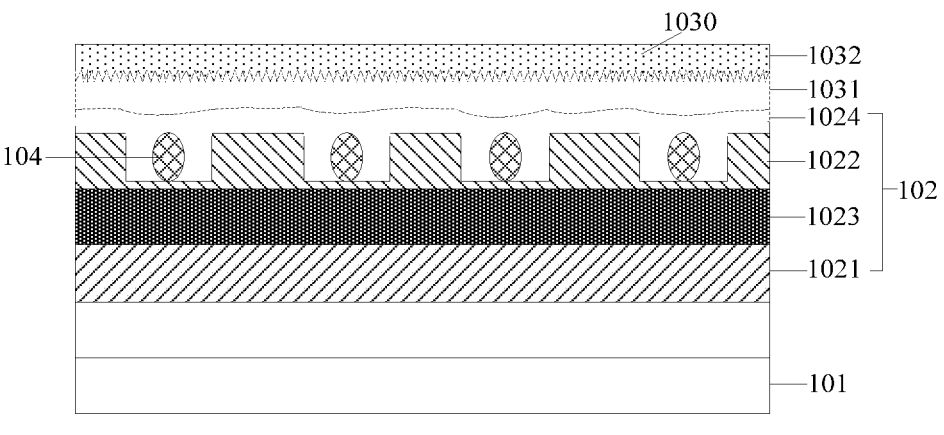

In a first possible implementation, as shown in FIGS. 7g to 7i, a current spreading layer 1024, which may be made of indium tin oxide (ITO), may be formed on the second doped semiconductor layer 1022. A transparent conductive material is spin-coated on the current spreading layer 1024, and may be at least one of graphene, carbon nanotubes, and nano-silver particles, so as to form a transparent conductive material layer 1031. Due to the characteristics of the transparent conductive material, a surface of the formed transparent conductive material layer 1031 away from the substrate 101 is rough and uneven and generally has a linear shape or a grid shape. Then, a quantum dot material 1030 is spin-coated on the transparent conductive material layer 1031, and may specifically be perovskite, so as to form a quantum dot material layer 1032. The surface of the transparent conductive material layer 1031 away from the substrate 101 is in a linear shape or a grid shape, and thus, may provide a carrying space for the quantum dot material 1030 in the quantum dot material layer 1032, so that the quantum dot material 1030 may be filled in the formed linear or grid-shaped space. In this way, the quenching caused by the agglomeration of the quantum dot material 1030 can be avoided, thereby preventing the color conversion efficiency from being influenced and improving the luminescence efficiency of the light-emitting device. In practical application, due to the existence of the grooves, the surface of the current spreading layer 1024 away from the substrate 101 may also be rough and uneven, so that the amount of light emitted by the light-emitting diode is increased, the excitation effect on the quantum dot material 1030 is increased, and the luminescence efficiency can be further improved.

Figure 7J:
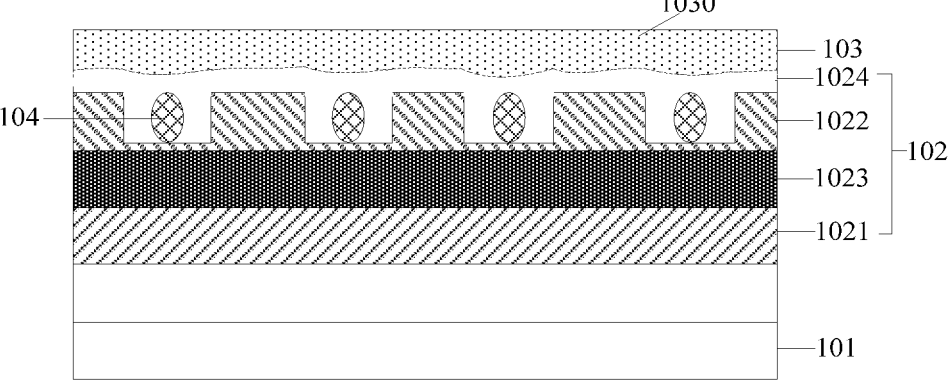
Figure 7K:
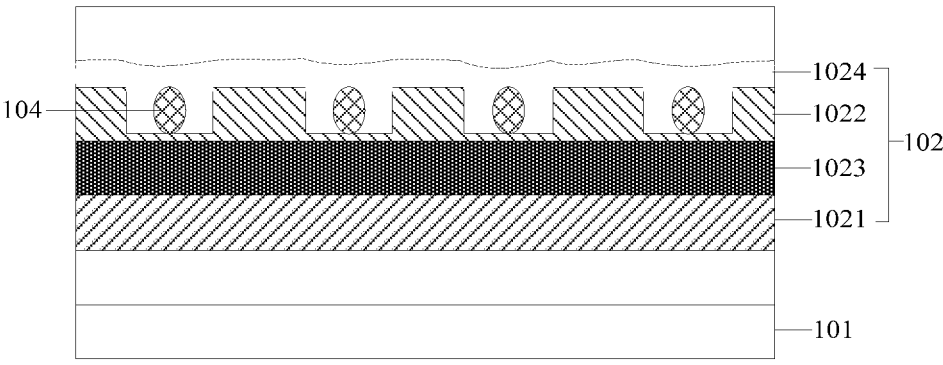
Figure 7L:
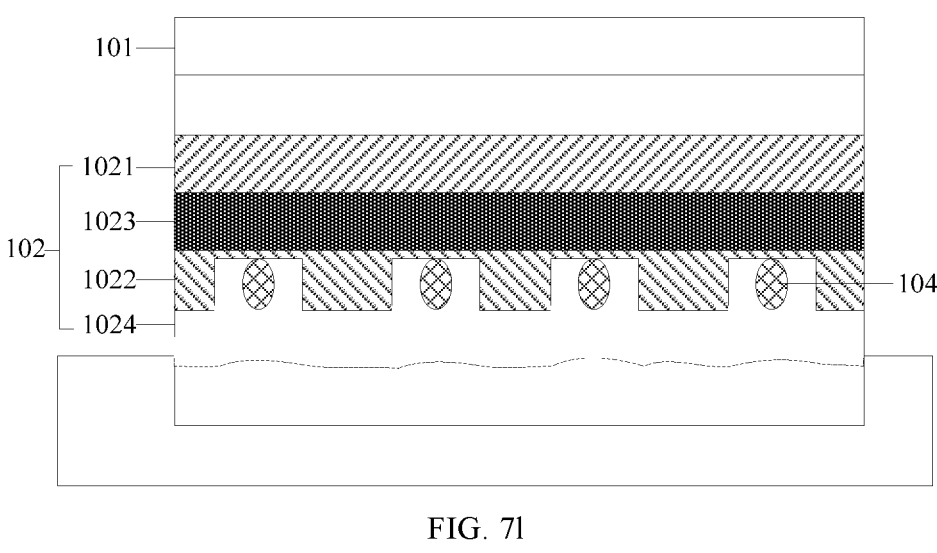
Figure 7M:
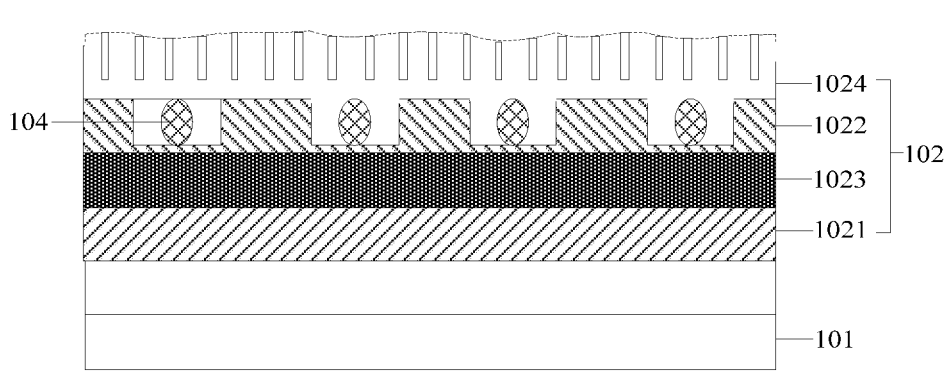
Figure 7N:
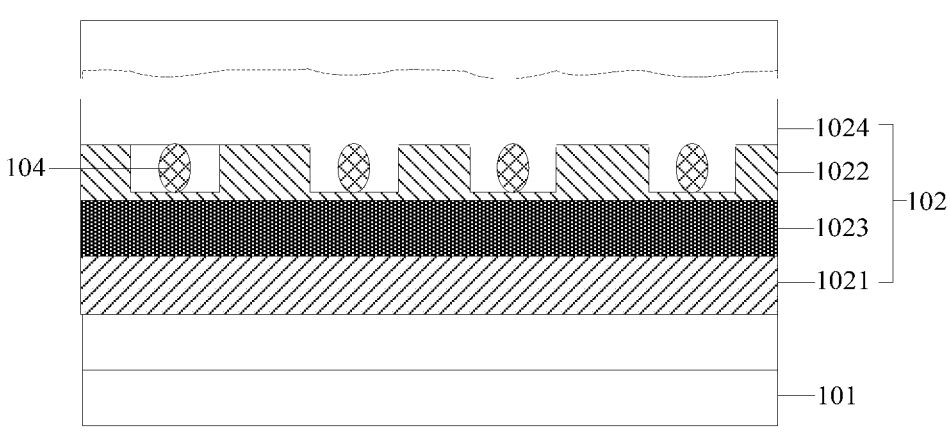
Figure 7O:
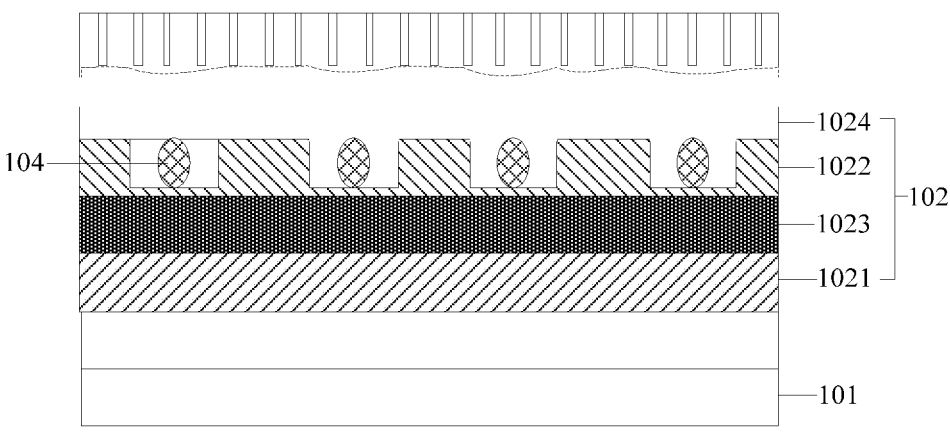
Figure 7P:
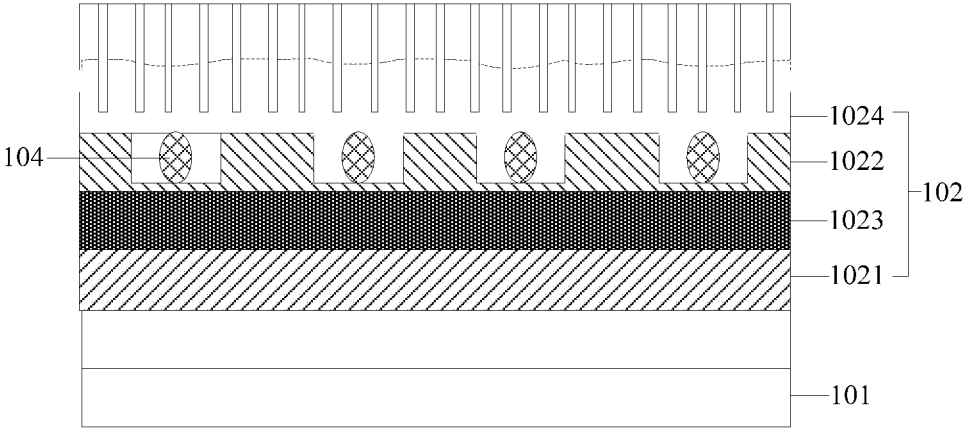
Figure 7Q:
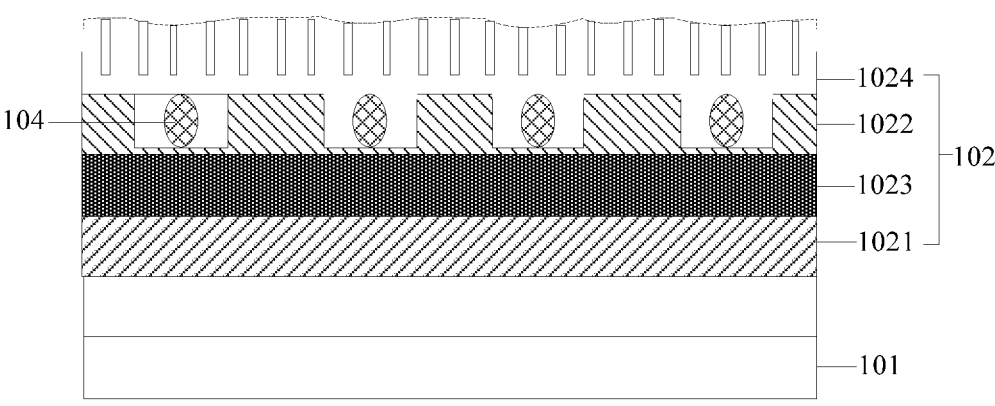

In a second possible implementation, as shown in FIGS. 7g and 7j, the current spreading layer 1024, which may be made of indium tin oxide (ITO), may be formed on the second doped semiconductor layer 1022. The transparent conductive material and the quantum dot material 1030 are mixed to form a mixture, and then the mixture is spin-coated on the current spreading layer 1024 to form the color conversion layer 103. The quantum dot material 1030 can be dispersed because the transparent conductive material is mixed in the quantum dot material 1030, so that the quenching caused by the agglomeration of the quantum dot material 1030 is avoided, thereby preventing the color conversion efficiency from being influenced and improving the luminescence efficiency of the light-emitting device. Meanwhile, the color conversion layer 103 is the single-layer structure, so that it is only necessary in the process for forming the color conversion layer 103 to mix the transparent conductive material and the quantum dot material 1030 in advance to form the mixture followed by spin-coating, thereby forming the color conversion layer 103. In this way, the spin-coating process is prevented from being performed several times, the process steps can be reduced, the manufacturing cost is saved. In the second possible implementation, before the color conversion layer 103 made of the mixture is formed, the mixture may be subjected to ultrasonic processing, so that the transparent conductive material and the quantum dot material 1030 are dispersed, and the quenching caused by the agglomeration of the quantum dot material 1030 is avoided, thereby preventing the color conversion efficiency from being influenced and improving the luminescence efficiency of the light-emitting device.

In a third possible implementation, as shown in FIG. 7g and FIGS. 7k to 7m, the current spreading layer 1024, which may be made of indium tin oxide (ITO), may be formed on the second doped semiconductor layer 1022. A zinc powder-ethanol solution is spin-coated on the current spreading layer 1024, a diameter of each pore in a nanometer level is closely related to a concentration of the zinc powder, the pores each with the diameter of about 100 nanometers are to be formed, and the concentration of the zinc powder is about 60 mg/ml. A dosage of 30 ul/cm$^2$ is spin-coated to the current spreading layer 1024 at a spin-coating speed in a range from 500 rad/min to 6000 rad/min for 30 s (the spin-coating speed affects the spreading of the zinc powder and further the pore diameter). The conductive glass is immersed in the hydrochloric acid-ethanol mixed solution to perform a reductive etching reaction on the current spreading layer 1024. Concentrations of the hydrochloric acid and the ethanol in the hydrochloric acid-ethanol solution influence a reaction rate, a concentration of the hydrochloric acid is in a range from 0.01 mol/L to 1 mol/L, a volume ratio of the ethanol to the water in the hydrochloric acid is in a range from 1 to 8. When the volume ratio is less than 1, the reaction is too fast and uncontrollable, and when the volume ratio is more than 8, the reaction is too slow. The etching reaction is performed for a certain time, after which the current spreading layer 1024 is washed with deionized water for three times, and is dried at 50° C. to form pores in the current spreading layer 1024.

Alternatively, the pores may be formed in other ways. As shown in FIG. 7g and FIG. 7n to FIG. 7q, the current spreading layer 1024, which may be made of indium tin oxide (ITO), may be formed on the second doped semiconductor layer 1022. A single layer of nano-imprinting adhesive is spin-coated on the current spreading layer 1024. the substrate with the spin-coated imprinting adhesive is imprinted in a spinning mode through an IPS by using an imprinting template AAO (anodic aluminum oxide) having round hole patterns (with a period of 100 nanometers) through a two-step method, so that the round hole patterns are transferred to the imprinting adhesive. Then, oxygen plasma is used to remove the residual adhesive, i.e., patterns of the pores of the imprinting adhesive are formed on the current spreading layer 1024. The current spreading layer 1024 is etched by using the imprinting adhesive as a mask, to form the pores in the current spreading layer 1024.

Figure 7R:
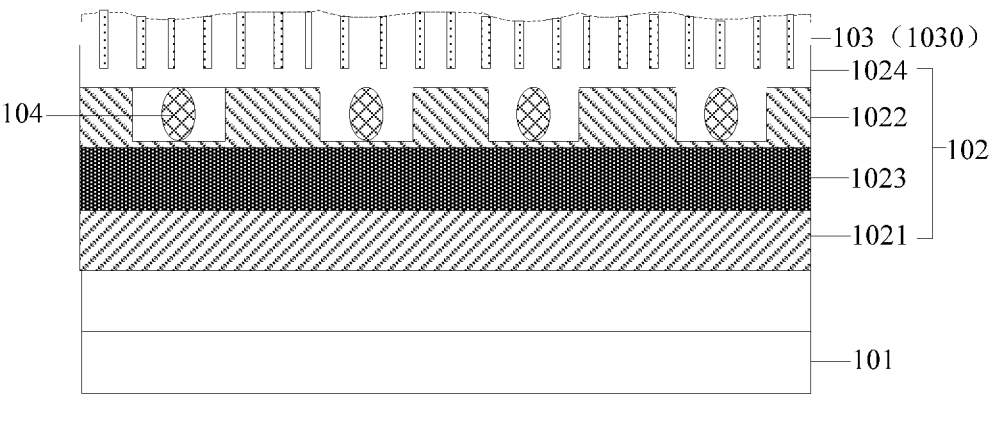

As shown in FIG. 7r, the etched current spreading layer 1024 is subjected to surface treatment, the zeta potential on the surface is changed, and the quantum dot material is spin-coated into the pores by virtue of an electrostatic adsorption force. The surface modification (the surface treatment) is performed on the zeta potential on the surface of the quantum dot material, and the surface of the quantum dot material is generally negative charged, and the current expansion layer 1024 is immersed in the PEG or PSS solution, so that the surface of the current expansion layer 1024 has positive charges. In order to avoid the QD agglomeration, a volatile solvent, such as toluene or n-octane or the like, is selected as a stock solution solvent of the quantum dot material, and may be naturally volatilized at room temperature, so that the agglomeration of the quantum dot material caused by a heating step is avoided as much as possible.

As shown in FIG. 6, the method for manufacturing a light-emitting device further includes step S605 of forming a metal layer on a side of the color conversion layer away from the substrate after step S604.

Figure 7S:
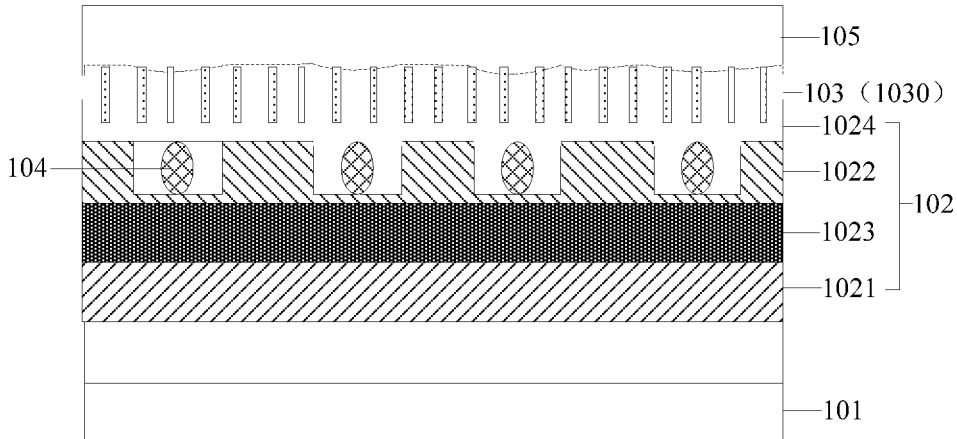
Figure 7T:
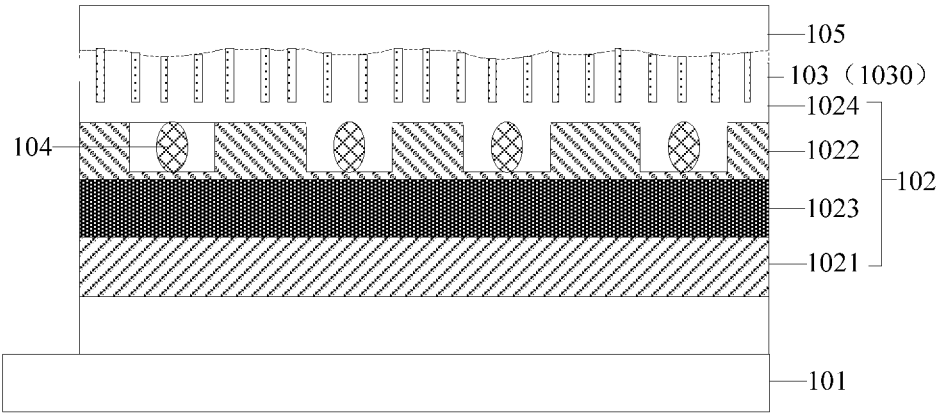
Figure 7U:
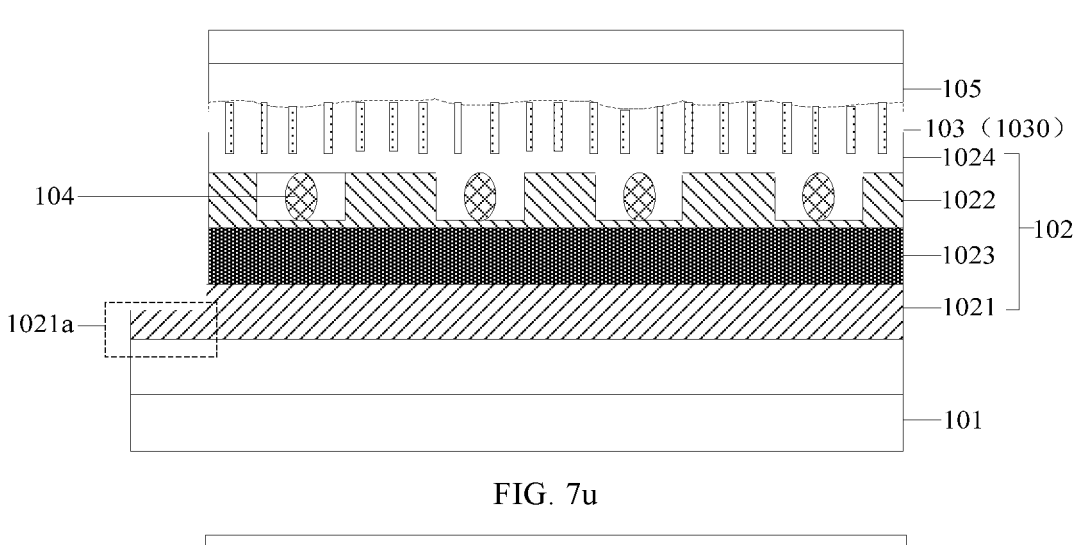
Figure 7V:
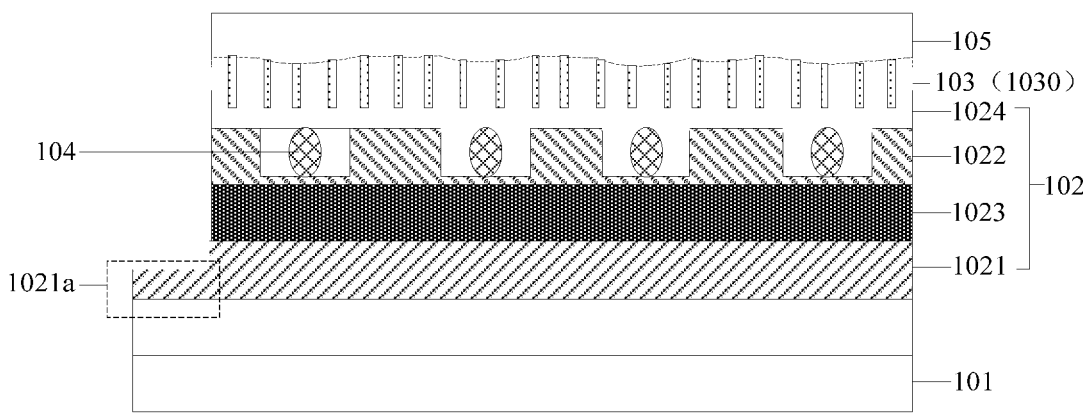
Figure 7W:
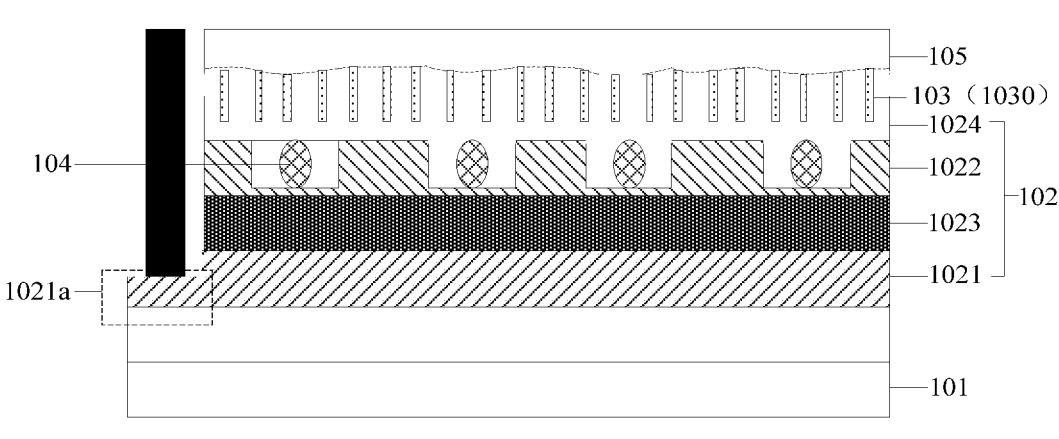
Figures 7X, 7Y:
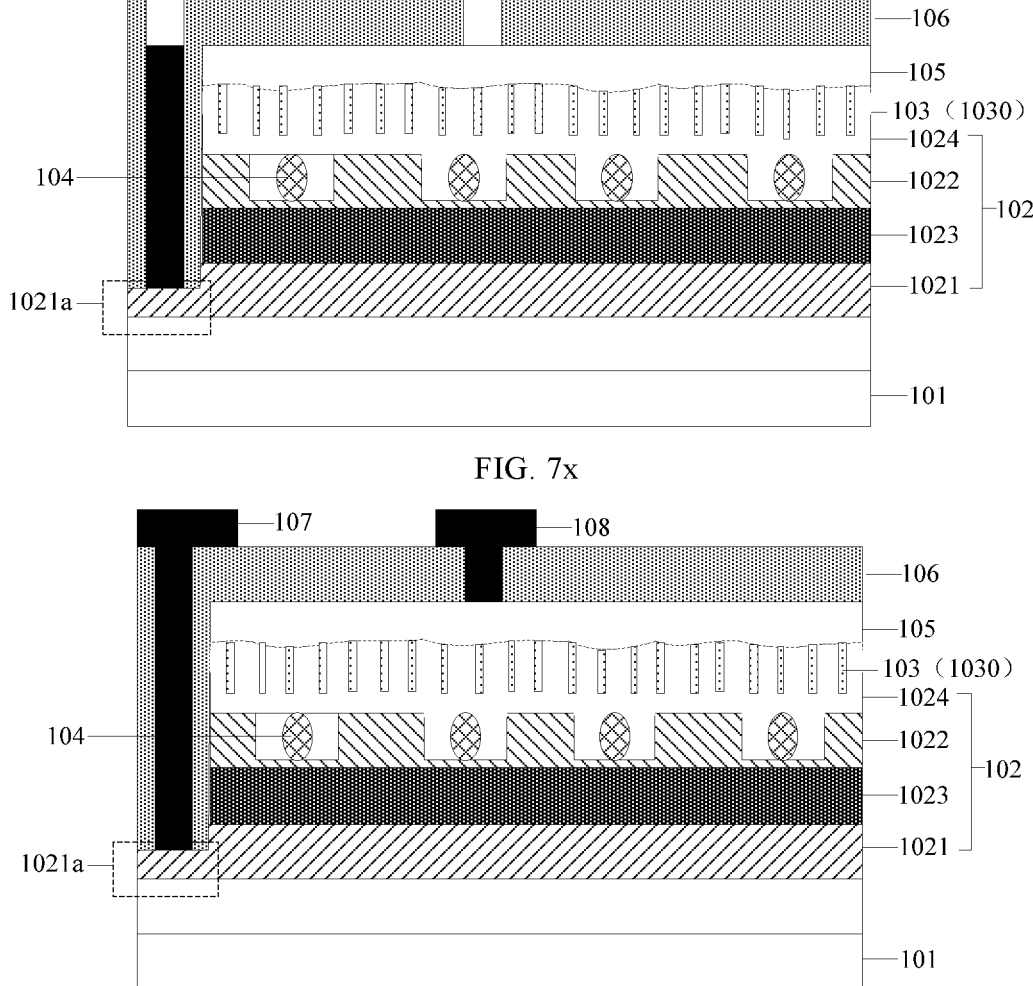

Specifically, as shown in FIG. 7s, the metal layer 105, which may be made of silver (Ag), is formed on the color conversion layer 103 with a thickness of about 100 nm through an evaporation process.

In some embodiments, after the light-emitting device is formed, the first connection electrode and the second connection electrode are further formed. Specifically, as shown in FIGS. 7t to 7y, the metal layer 105 is removed by wet etching using a silver etching solution, the current spreading layer 104 may be etched by an electrochemical method, the quantum dot material 1030 is stripped as the current spreading layer 104 is etched, and then the second doped semiconductor layer 1022 and the quantum well layer 1023 are removed by a conventional process. The first doped semiconductor layer 1021 is protected by photoresist and then etched to form the lapping stage. An ultrasonic cleaning process is performed with acetone, ethanol and water to remove the redundant photoresist. The first connection electrode 107 is formed by adopting thermal evaporation process or E-beam electron beam evaporation process, and is made of the electrode metal such as Au or Ti/Al/Ni/Au alloy, and the temperature for evaporating metal and annealing is selected to be lower than 300° C. A passivation layer 106 is formed by utilizing silicon oxide through a plasma enhanced chemical vapor deposition process, wherein a thickness of the passivation layer 106 is about 300 nanometers, so that the whole device is encapsulated and protected, and a pattern of the passivation layer is formed by etching. The first connection electrode 107 is thickened while a second connection electrode 108 is formed. The second connection electrode 108 is formed by adopting E-beam electron beam evaporation process at the temperature for annealing of 250° C. for 10 minutes, and is made of the Ti/Al/Ni/Au alloy with a thickness of 30/175/35/1000 nanometers; or the second connection electrode 108 is made of the Cr/Pt/Au alloy with a thickness of 20/20/1000 nanometers. The light-emitting device is then cut into a desired chip size.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A light-emitting device, comprising:
a substrate;
a light-emitting diode on the substrate;
a color conversion layer on a side of the light-emitting diode away from the substrate;
a plurality of grooves in a surface of the light-emitting diode away from the substrate; and
nano-metal particles filled in the plurality of grooves;
a metal layer on a side of the conversion layer away from the substrate and electrically connected to the light-emitting diode; and
a contact electrode electrically connected to the metal layer and for driving the light-emitting diode.

2. The light-emitting device of claim 1, wherein the nano-metal particles and the metal layer are made of a same material; and
a material of the nano-metal particles comprises: at least one of silver, gold, platinum, palladium or iridium.

3. The light-emitting device of claim 1, wherein a diameter of each nano-metal particle is less than or equal to 100 nanometers; and
a spacing value between any two adjacent nano-metal particles of the nano-metal particles is greater than or equal to 1 micrometer.

4. The light-emitting device of claim 1, wherein the light-emitting diode comprises: a first doped semiconductor layer and a second doped semiconductor layer opposite to each other and a quantum well layer between the first doped semiconductor layer and the second doped semiconductor layer; and
the plurality of grooves are in a surface of the second doped semiconductor layer away from the substrate; and
a depth of each groove is less than a thickness of the second doped semiconductor layer.

5. The light-emitting device of claim 3, wherein the light-emitting diode further comprises: a current spreading layer; and
the current spreading layer is on a side of the second doped semiconductor layer away from the substrate.

6. The light-emitting device of claim 5, wherein the color conversion layer comprises: a transparent conductive material layer and a quantum dot material layer;
the transparent conductive material layer is on a side of the current spreading layer away from the substrate, and a surface of the transparent conductive material layer away from the substrate has a line shape or a grid shape; and
the quantum dot material layer is on a side of the transparent conductive layer away from the substrate, or
the color conversion layer comprises: a mixture of the transparent conductive material and the quantum dot material.

7. The light-emitting device of claim 6, wherein the transparent conductive material comprises: at least one of graphene, carbon nanotubes and second nano-metal particles.

8. The light-emitting device of claim 5, wherein the color conversion layer comprises: a quantum dot material;
the light-emitting device further comprises a plurality of pores in a surface of the current spreading layer away from the substrate; and
the quantum dot material is filled in the plurality of pores.

9. The light-emitting device of claim 8, wherein a surface of each of the plurality of pores has charge potential opposite to charge potential of a surface of the quantum dot material.

10. The light-emitting device of claim 8, wherein the current spreading layer has a thickness in a range from 10 nanometers to 100 nanometers; and
each pore has a diameter in a range from 10 nanometers to 100 nanometers.

11. The light-emitting device of claim 4,
wherein the connection electrode is a second connection electrode and the first doped semiconductor layer comprises a lapping stage;
the light-emitting device further comprises: a passivation layer covering the lapping stage and the metal layer, and a first connection electrode and the second connection electrode on a side of the passivation layer away from the substrate; the first connection electrode is electrically connected to the lapping stage through a via extending through the passivation layer; and
the second connection electrode is electrically connected to the metal layer through a via extending through the passivation layer.

12. A display apparatus, comprising a plurality of light-emitting devices, each of which is the light-emitting device of claim 1.

13. A method for manufacturing a light-emitting device, comprising:
forming a light-emitting diode on a substrate;
forming a plurality of grooves in a surface of the light-emitting diode away from the substrate;
filling nano-metal particles in the plurality of grooves;
forming a color conversion layer on a side of the light-emitting diode away from the substrate
forming a metal layer covering the conversion layer and on a side of the conversion layer away from the substrate; and
forming a contact electrode electrically connected to the metal layer and for driving the light emitting-diode.

14. The method of claim 13, wherein
the forming the light-emitting diode on the substrate comprises:

sequentially forming a first doped semiconductor layer, a quantum well layer and a second doped semiconductor layer on the substrate.

15. The method of claim 14, wherein the filling the nano-metal particles in the plurality of grooves comprises:

forming a silicon oxide layer on a side of the second doped semiconductor layer away from the substrate;

forming a patterned photoresist layer on a side of the silicon oxide layer away from the substrate;

etching the silicon oxide layer and the second doped semiconductor layer by using the patterned photoresist layer as a mask, wherein the plurality of grooves are formed in a surface of the second doped semiconductor layer away from the substrate;

forming a nano-metal particle layer on the silicon oxide layer, and annealing the nano-metal particle layer to form the nano-metal particles, such that the nano-metal particles are filled in the plurality of grooves; and stripping the silicon oxide layer by using an acid solution, such that redundant nano-metal particles are removed along with the stripping the silicon oxide layer.

16. The method of claim 14, wherein after the sequentially forming the first doped semiconductor layer, the quantum well layer and the second doped semiconductor layer on the substrate, the method further comprises:

forming a current spreading layer on a side of the second doped semiconductor layer away from the substrate.

17. The method of claim 16, wherein the forming the color conversion layer on the side of the light-emitting diode away from the substrate comprises:

forming a transparent conductive layer on a side of the current spreading layer away from the substrate by spin-coating, wherein a surface of the transparent conductive layer away from the substrate has a line shape or a grid shape; and forming a quantum dot material layer on a side of the transparent conductive layer away from the substrate by spin-coating.

18. The method of claim 16, wherein the forming the color conversion layer on the side of the light-emitting diode away from the substrate comprises:

mixing a transparent conductive material and a quantum dot material to form a mixture, and forming the color conversion layer by spin-coating the mixture on a side of the current spreading layer away from the substrate; and wherein after the mixing the transparent conductive material and the quantum dot material to form the mixture, the method further comprises:

performing an ultrasonic treatment on the mixture so that the transparent conductive material and the quantum dot material are dispersed.

19. The method of claim 16, wherein after the forming the current spreading layer on the side of the second doped semiconductor layer away from the substrate, the method further comprises:

performing a reductive etching reaction on the current spreading layer by using a zinc powder-ethanol solution, and forming a plurality of pores in a surface of the current spreading layer away from the substrate, or imprinting a photoresist layer by using a nano-imprinting template to form a patterned photoresist layer; and etching the current spreading layer by using the patterned photoresist layer as a mask, and forming a plurality of pores in a surface of the current spreading layer away from the substrate.

20. The method of claim 19, wherein the forming the color conversion layer on the side of the light-emitting diode away from the substrate comprises:

processing the surface of the current spreading layer away from the substrate to change a potential of the surface;

processing a solution of a quantum dot material, such that a potential of the quantum dot material is opposite to the potential of the surface of the current spreading layer away from the substrate; and spin-coating the solution of the quantum dot material on the surface of the current spreading layer away from the substrate, such that the quantum dot material is filled in the plurality of pores.

* * * * *